United States Patent

Gianpaolo et al.

[11] Patent Number: 5,848,705
[45] Date of Patent: Dec. 15, 1998

[54] METHOD AND APPARATUS FOR AUTOMATIC LOADING AND UNLOADING OF PRINTED CIRCUIT BOARDS ON MACHINES FOR ELECTRICAL TESTING

[75] Inventors: Antonello Gianpaolo; Marchi Giovanni; Martini Riccardo, all of Verona, Italy

[73] Assignee: Circuit Line SPA, Verona, Italy

[21] Appl. No.: 566,174

[22] Filed: Dec. 1, 1995

[30] Foreign Application Priority Data

Nov. 30, 1994 [IT] Italy .................................. MI94A2422

[51] Int. Cl.⁶ ..................................................... B07C 5/344
[52] U.S. Cl. .......................... 209/571; 209/573; 209/905; 198/346.2; 324/158.1
[58] Field of Search ..................................... 209/552, 559, 209/562, 563, 564, 571, 573, 606, 922, 934, 939, 905; 198/346.2; 414/222, 225, 404, 416; 324/158.1

[56] References Cited

U.S. PATENT DOCUMENTS

| | | |
|---|---|---|
| 4,208,675 | 6/1980 | Bajon et al. . |
| 4,212,031 | 7/1980 | Schmitt et al. . |
| 4,305,097 | 12/1981 | Doemens et al. . |
| 4,593,820 | 6/1986 | Antonie et al. ........................... 209/573 |
| 4,682,695 | 7/1987 | Hasenbalg ......................... 198/364.2 X |
| 4,867,297 | 9/1989 | Saitoh et al. .......................... 198/346.2 |
| 5,150,797 | 9/1992 | Shibata ..................................... 209/573 |
| 5,299,693 | 4/1994 | Ubaldi et al. ....................... 209/571 X |

FOREIGN PATENT DOCUMENTS

| | | |
|---|---|---|
| 0 304 943 A2 | 3/1989 | European Pat. Off. . |
| 0 651 260 A2 | 5/1995 | European Pat. Off. . |
| 6009007 | 1/1994 | Japan ..................................... 209/573 |

*Primary Examiner*—Tuan N. Nguyen
*Attorney, Agent, or Firm*—Sixbey, Friedman, Leedom & Ferguson; David S. Safran

[57] ABSTRACT

A method is described for automatic loading and unloading of printed circuit boards on machines for electrical testing, consisting of feeding the circuits to be tested into a pick-up area (16), detecting the position of the single circuits and comparing the position detected with a correct reference position, transferring the circuits from the pick-up area (16) to a loading area (4) on the test machine, taking into account during transfer any deviation of the actual position of the circuit board from the reference position, so that the circuit is always picked up in the same way, to be set down in the pre-established region of the loading area (4), and unloading the tested circuits from the area (4) of the machine onto a discharge line (7) for good circuits and a magazine (17) for faulty circuits, depending upon the test result.

19 Claims, 3 Drawing Sheets

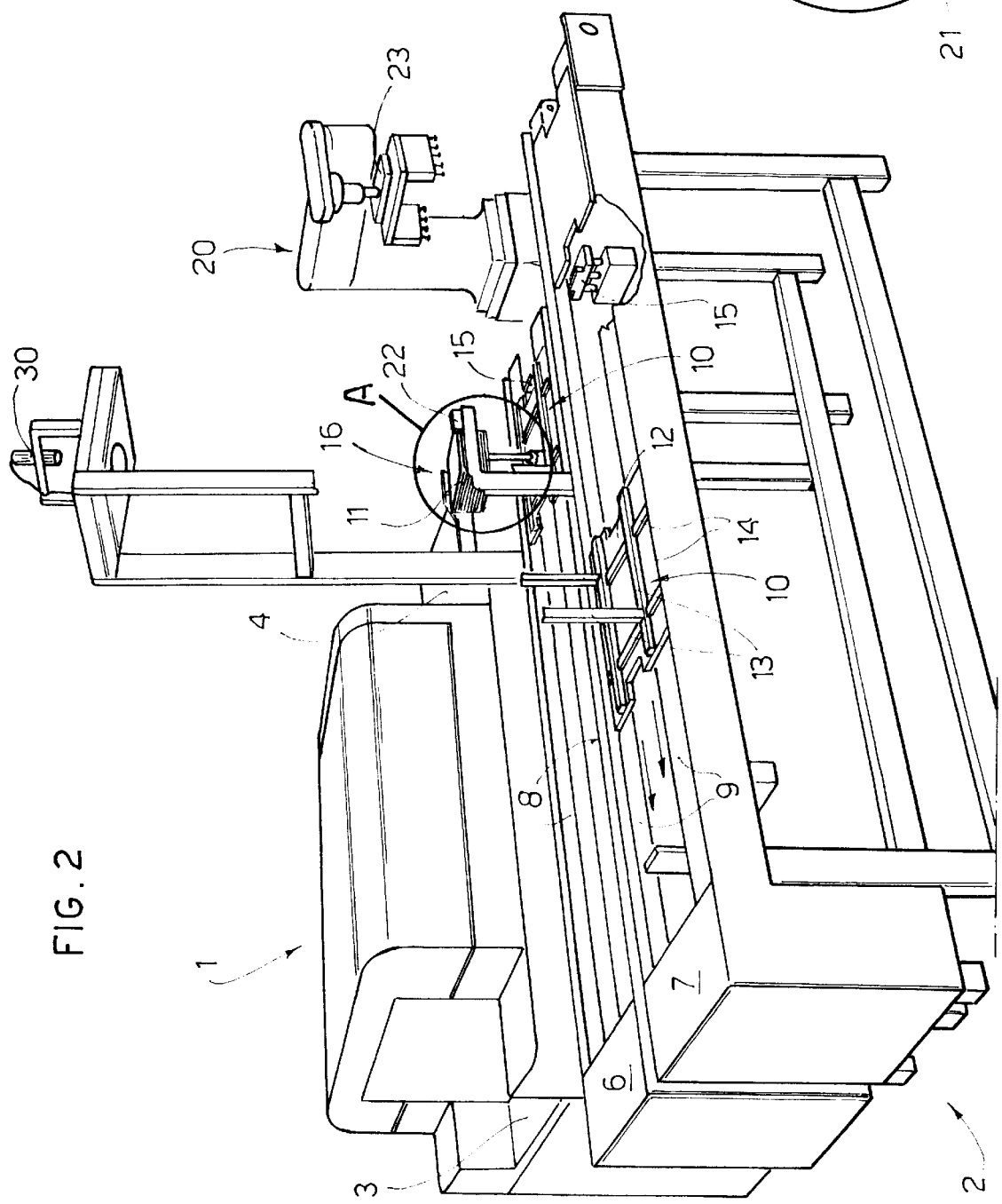

METHOD AND APPARATUS FOR AUTOMATIC LOADING AND UNLOADING OF PRINTED CIRCUIT BOARDS ON MACHINES FOR ELECTRICAL TESTING

BACKGROUND OF THE INVENTION

The present invention relates to a method and an apparatus for automatic loading and unloading of printed circuit boards on machines for electrical testing.

As is known, the electrical test on an unassembled printed circuit involves verifying that all the nets present on the printed circuit board are insulated from each other and that there is electrical continuity between the points in each net. For this purpose special machines are employed which use suitable electrical contact grids to establish connections with well defined points of the printed circuit that is loaded onto the machine.

Automation is not very widespread in unassembled printed circuit testing mainly because of the considerable diversity of the objects to be manipulated.

Each printed circuit differs from the others in shape, size and accuracy of manufacture.

Furthermore, the average size of the batches of circuits and the large number of different batches handled in a work shift are such as to discourage use of an automatic system in that the initial calibrating time would reduce productivity to inadequate levels for an automatic system.

For the reasons set out, any attempts at automation in this sector to date have caused test machines to be tied to dedicated apparatus that allow automation to be used only on objects with well defined characteristics.

The known automation devices generally have a system of tracks, adjusted to the width of the printed circuit to be tested which, for example through the use of belts, transfer the printed circuit from the loading area to the test area and then to the unloading area.

Positioning in each area is carried out through mechanical stop systems.

It follows that to guarantee precision and reproducibility of the transfer and positioning operations for all the circuits in a batch, the edges of the circuits must be precisely machined and preferably milled.

Other constraints imposed by known automation systems concern the shape of the circuits, which must not have curved surfaces, and their thickness which must be sufficient to confer rigidity to the object, both for positioning on the mechanical stops and for precision of transfer.

The general precision required by these known systems also imposes limits on the maximum height of the pile of printed circuits in the loading area, to avoid positioning differences between the first and last circuits of the pile, Piles no higher than 300 mm, containing about 200 circuits each 1.6 mm thick, are normally used. This limits the capacity of the system, in that, given the present test speeds, a new pile of circuits must be provided every 30 minutes at most.

Furthermore, these known sequential transfer systems do not allow more than one circuit to be tested in a single test, even if the test area of the machine is large enough to hold more than one circuit.

An aim of the invention is to allow automatic loading and unloading on test machines of any printed circuit, irrespective of its shape, size and precision of manufacture.

Another aim of the invention is to provide an automatic circuit loading and unloading system that can be adapted to virtually any machine with manual or automatic loading, even if already installed at the user's facility.

Another aim of the invention is to guarantee a great capacity of circuits, that can in any case be increased on the basis of the user's requirements, and on the basis of the implementation chosen.

Yet another aim of the invention is to allow more than one circuit to be tested in a single test (so-called multiple test), depending upon the size of the circuit and the test area of the machine.

Yet another aim of the invention is to create a system that allows circuit boards that are not correctly oriented in the loading area to be identified and their position corrected, allowing them to be manipulated and tested.

Yet another aim of the invention is to allow unidentified circuits to be discarded.

These aims are achieved with the method and the apparatus according to the invention.

According to the invention at least one printed circuit handling member is provided, intercommunicating with a system for detecting the position of the printed circuit to be loaded, so that the printed circuit is always picked up with the same reference and subsequently always set down in the same position in the appropriate region of the test area of the machine, or of a transporter or carrier that moves the circuit in the test area.

Correct setting down in this area and picking up of the printed circuit after the test are ensured by special centring pins.

The detection system is advantageously a vision system comprising at least one telecamera that "reads" the circuit, identifying the established reference points. If these are not in the initial positions memorised, the handling member, preferably a robot, is instructed to adjust to the new position of the circuit, so that it is taken exactly in the established points.

The pick-up system of the robot advantageously consists of a set of suckers that work through vacuum.

The robot can be programmed for each type of circuit, so as to allow transfer of printed circuits into different locations in the case of multiple tests.

The printed circuits to be tested are advantageously piled one on top of the other in magazines that can have any depth wished as any deviation from the ideal position will not jeopardise the precision of transfer of the circuit.

Further characteristics of the invention will become clearer from the detailed description that follows, referring to a purely exemplary and therefore non-limiting embodiment illustrated in the attached drawings.

DETAILED DESCRIPTION OF THE DRAWINGS

FIG. 2 is an axonometric side view of the apparatus in FIG. 1;

FIG. 3 illustrates the detail indicated by letter A in FIG. 2;

DETAILED DESCRIPTION OF THE PREFERRED EMBODIMENTS

Figure 1:
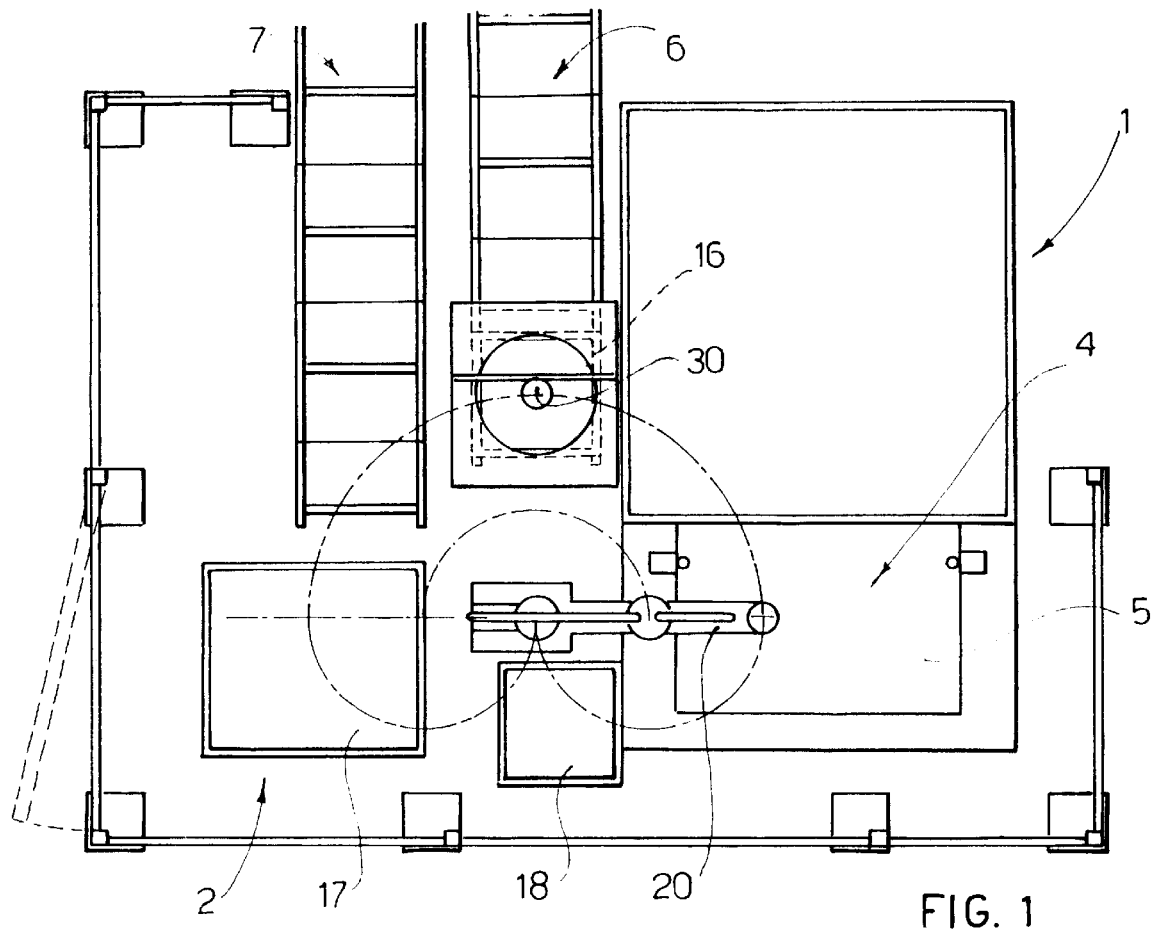
FIG. 1 is a schematic plan view from above of a possible embodiment of the apparatus according to the invention combined with a machine for electrical testing of printed circuits.

In FIGS. 1 and 2 a machine for electrical testing of printed circuits is shown schematically and indicated as whole by reference number 1. The automatic circuit loading and unloading apparatus according to the invention is combined with said machine and indicated as a whole by reference number 2.

In particular, test machine 1 is of the type described in European patent application No. 94116547.4, and corresponding U.S. Pat. No. 5,614,819, to which reference should be made for further details, and comprises two stations: a work station 3 (see FIG. 2), where the test is performed on the circuit, and a loading/unloading station 4, where the circuits are set down after being moved automatically in the work station 3 and being brought into the station 4 again after the test. Transfer of the circuits between the two stations 3 and 4 takes place by means of special transporters or carriers 5 that travel in opposite directions on parallel planes one above the other, so that while one carrier is in the work or test station, the other is in the loading/unloading station.

It is clear, however, that the test machine 1 thus structured has been illustrated only by way of example, and that any other type of test machine can be used with the apparatus according to the invention. In particular, the machine 1 can also be a manual circuit loading machine, in which case the station 4 where the circuits are set down corresponds to the test area of the machine.

In the embodiment illustrated in the attached drawings, the apparatus 2 substantially comprises a feeding line 6 for the circuits to be tested and an emptying line 7 for the correct circuits that have passed the test.

The two lines 6 and 7 advantageously consist of conveyor belts and are parallel and side by side. It is obvious, however, that other geometrical arrangements and other conveying means can be used.

In particular, each conveyor comprises a pair of parallel belts 8, 9, respectively, with a space between them, for conveying containers or pallets 10, only two of which are shown in FIG. 2, able to contain a pile of printed circuits 11. In the embodiment shown schematically in FIG. 2, each pallet 10 has a centrally perforated base 12, from which a pair of vertical guide rods 13 rise in diagonally opposite positions and between which the pile of printed circuits 11 is blocked. A set of four adjustable cursors 14 is provided on the base 12 to adapt the pallet 10 to the size of the different circuits.

Mechanical stops 15 are disposed along the conveyors 6 and 7 in appropriate positions to block the pallets 10 during operation of the apparatus.

In particular, a stopping area for the pallets 10 is provided in the front end portion of the feeding line 6, to form a loading magazine 16 for the circuits that are taken from a handling assembly 20, in particular a robot, that is responsible for transferring the circuits, as will be better explained below.

The pile of circuits 11 is raised each time a circuit has been picked up, by means of a linear actuator 21 (see detail in FIG. 3), so that the robot 20 always picks up the circuit at the same height.

For this purpose, photoelectric cells 22 are provided which detect the presence of the first printed circuit 11 in the pile, stopping the lifting movement of the actuator 21.

Above the loading area 16 is situated a vision system 30, comprising in particular a telecamera that views the first printed circuit 11 of the pile, determining its exact position, through previously established datum points on the circuit.

Figure 4:
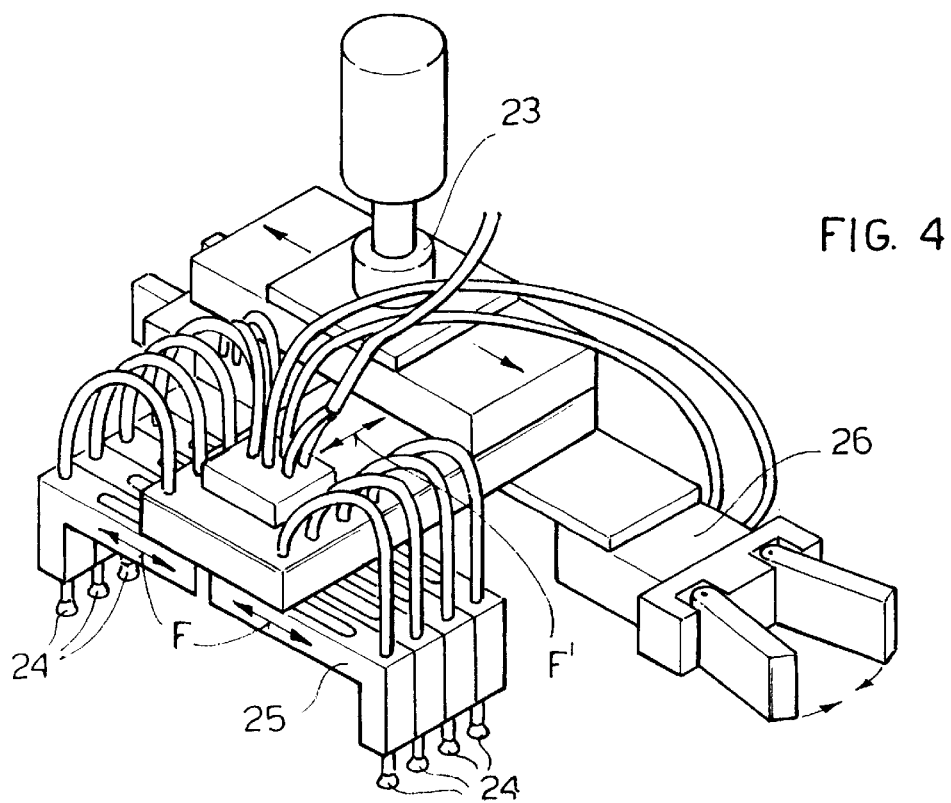
FIG. 4 is an axonometric view of the head of the handling element, bearing the printed circuit pick-up member and the pick-up member for the relative containers or pallets.
Figure 5:
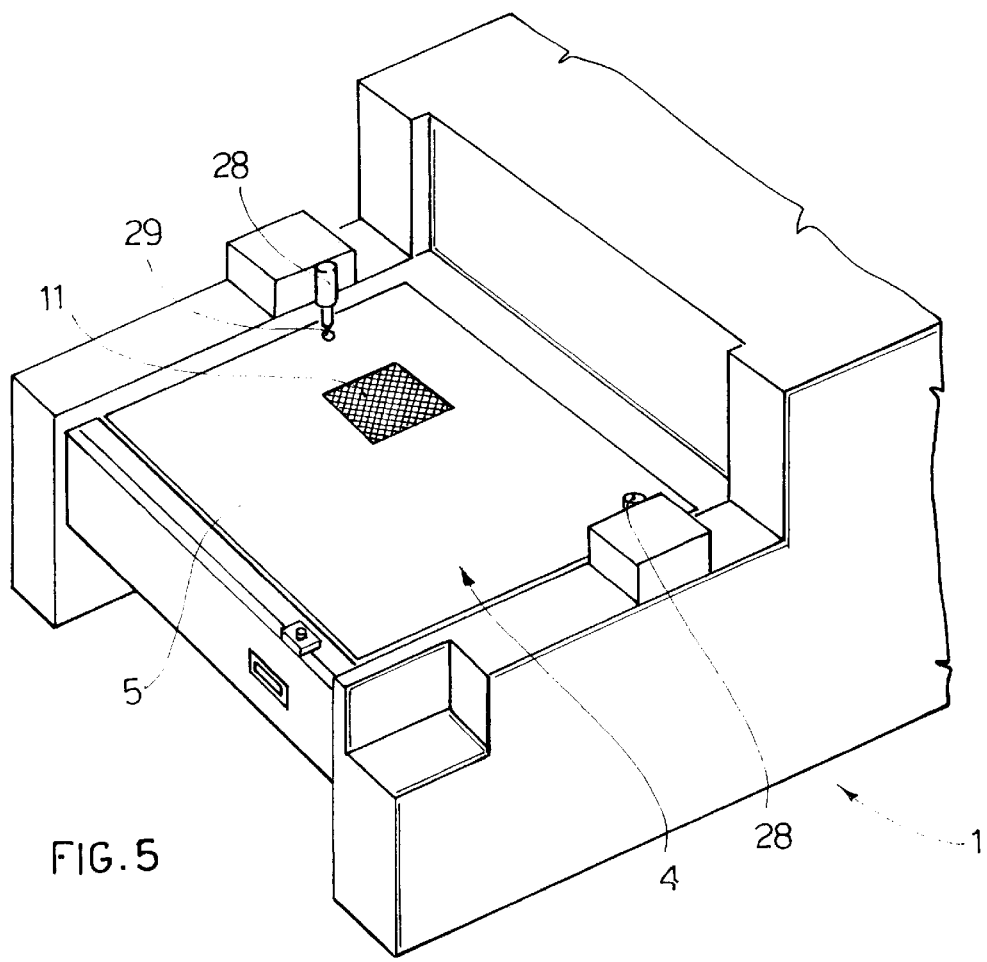
FIG. 5 is a schematic axonometric view illustrating the centring system of the printed circuit setting down area of the test machine.

The handling assembly, or robot 20, has a head 23, shown in detail in FIG. 4, equipped with a series of suckers 24, whose position can be adjusted so that they can be disposed on areas of the printed circuit 11 without holes, since they work through vacuum. As a result the position of the suckers 24 must be adjusted each time the batch of circuits is changed.

Adjustment of the suckers 24 can be carried out manually, or more advantageously, with automatic handling systems that can be guided directly by the computer of the robot. In fact the design of the printed circuit is described in numerical format, so that the most suitable position of the suckers can easily be programmed and they can be adjusted without any need for operator intervention time.

Each sucker 24 is mounted on a support 25 that can be moved in the direction of the double arrow F, and the whole sucker block can be moved in the direction of the double arrow F', at right angles to the previous one, so that each area of the printed circuit can be reached.

The head 23 can be detached from the robot 20, either for maintenance or for replacement by another type of pick-up.

Besides the pick-up system with suckers 24 for the printed circuits 11, the head 23 also comprises tongs 26 to pick up the pallets 10 suitable for gripping the respective vertical rods 13, so as to automatically transfer the empty pallets from the feeding line 6 to the emptying line 7, as will be better explained below.

In the example shown in the attached drawings, the capacity of the system, in terms of circuits that can be tested without operator intervention, is given by the number of pallets 10 contained on the feeding line 6 multiplied by the number of circuits that can be piled on a pallet.

It is obvious, however, that the total number of circuits can be increased both by increasing the number of pallets 10, by providing longer lines for example and/or smaller pallets or by increasing the number of circuits in the pallets, namely by providing deeper pallets and/or thinner circuits.

Loading and unloading trolleys equipped with special lifting devices, within the scope of an expert in the field, can be provided instead of the conveyors 6 and 7.

In order to ensure that the robot 20 always sets down its printed circuit 11 in exactly the same area of the loading station 4, a carrier or tray loading system 5 is provided, consisting in particular of a pair of taper pins 28 that engage in corresponding holes 29 made on each carrier or tray 5, of such a diameter as to guarantee the maximum error recovery allowed by the tray guide system.

As can be seen on examination of the plan in FIG. 1, besides the feeding line 6 and the emptying line 7 for circuits that have passed the test (OK circuits), an unloading magazine for faulty circuits 17 (NOT OK circuits) is also provided, as well as a magazine for unidentified circuits 18.

The work cycle provides for the head 23 of the robot 20 to be positioned above the loading station 4 of the test machine 1 whilst waiting for the carrier or tray 5 to arrive with the tested printed circuit 11.

At the end of the test the trays 5 are exchanged and the printed circuit to be tested is brought into the work station 3 of the machine, whilst the tested circuit is brought into the loading station 4.

Whilst the test on the new printed circuit is taking place, the robot 20 picks up the circuit already tested and, depending upon the result of the test, sets it down in the good circuits pallet 10, on the emptying line 7 or in the faulty circuits magazine 17.

The robot then positions itself on the pallet 10 in the pick-up area 16 and, on the basis of the data provided by the vision system 30, picks up the circuit 11 correctly to set it down on the tray 5 situated in the loading station 4 of the test machine 1. The pick-up position for the circuit is corrected on the basis of the readings of the real position of the circuit made by the vision system 30, so that they are aligned with sufficient precision (less than 0.5 mm) with the pins present on the setting down tray 5.

In the event that the vision system 30 is unable to detect the stored datum points of the circuit, it tells the robot 20 not to load this object for the test and it is then set down in the magazine for unidentified circuits 18. The robot 20 then continues its cycle with the next circuit in the pile.

In the case of a work cycle for multiple test, that is when more that one circuit 11 is placed simultaneously on a tray 5, the robot 20 repeats the cycle described as many times as required for the multiple number of circuits, obviously adapting the stored setting down path for each circuit.

When the circuit pallet 10 in the pick-up area 16 is empty, its status is detected by a photoelectric cell that is not illustrated, situated at the bottom of the elevator system 21, and the robot 20 is told to move said pallet from the feeding line 6 to the emptying line 7 for good circuits. Following this, a new pallet 10, previously blocked by a stop 15, is brought forward into the pick-up area 16.

Figure 6:
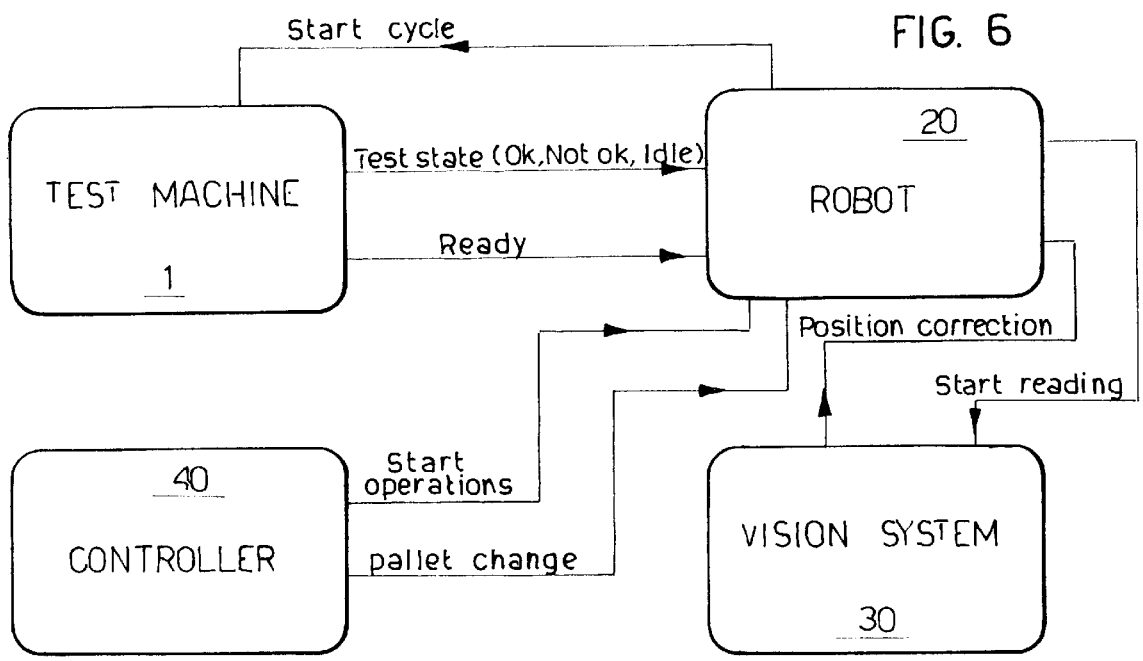
FIG. 6 is a simplified block diagram describing operation of the system.

Operation of the system is now described with reference to the block diagram in FIG. 6.

The start of operations is given by the system controller 40, which must check that the pallet 10 containing the circuits 11 is in the pick-up area 16 of the feeding line 6.

The "Start Operations" signal is transmitted to the robot 20 which, being at the first cycle, asks the vision system 30 for the reading of the position of the circuit to be loaded, through the "Start Reading" signal.

The CCD telecamera 30 reads the datum points on the circuit 11 and determines their position, comparing it with the corresponding positions stored in an earlier calibration stage.

The result of this process is represented by the "position correction" message that is transmitted to the robot 20, so that the circuit can always be coupled in the same way.

After the circuit has been picked up, the robot 20 asks the vision system for the reading of the position of the next circuit to be loaded, through the "Start Reading" signal.

The head 23 of the robot 20 then positions itself on the loading station 4 of the test machine 1, and starts setting down only if the machine has signalled that the tray 5 is in position through the "Ready" signal.

On completion of setting down, the robot 20 tells the test machine 1 that it can start its work, through the "Start Cycle" signal.

The exchange of trays 5 takes place in the test machine, after which the machine 1 signals to the robot 20 that the circuit is ready for picking up (actually, in the case of the first cycle there is no circuit since the second tray must also be loaded), through the "Ready" signal.

The robot reads the test result from the machine 1 and sets down the tested circuit in the pallet 10 of good circuits positioned on the emptying line 7, if the test is OK, or in the magazine for rejects 17 in the event of TEST NOT OK.

If, for any reason, the test has to be repeated (IDLE STATE), the robot 20 does not pick up the circuit that has just been tested, but continues to wait for the next tested circuit.

Alongside the standard cycle described there exist two special cycles.

The first takes place when the vision system 30 signals to the robot 20 that it has not identified the circuit 11. In this case the robot 20 does not convey the circuit to the test machine 1 but to the magazine for unidentified circuits 18, after which the cycle is repeated.

The second cycle takes place when the controller 40 recognises the end of the circuits in the pick-up area 16, and therefore instructs the robot 20 to pick up the empty pallet 10, through the "pallet change" signal, and to convey it to the emptying line 7 for good circuits.

The controller 40 then brings forward a new pallet 10 with the circuits 11 to be tested and restarts the cycle through the "Start Operations" signal.

From what is described the advantages over traditional systems of the method and apparatus for automatic loading and unloading of printed circuits on machines for performing the electrical test according to the invention are clear.

It should be noted that the circuit loading and unloading operations normally take place in shorter times than are required to test them, so no idle times are foreseen for the machine, except when it is necessary to move an empty pallet 10 from the feeding line 6 to the emptying line 7.

It is also clear that the apparatus according to the invention is completely independent from the test machine 1 and can therefore be adapted to any test machine, for example moved from one machine to another, whereas prior art apparatuses are normally of the dedicated type.

We claim:

1. A method for automatic loading and unloading of printed circuit boards on machines for carrying out electrical testing, comprising the steps of:

conveying the printed circuit boards to a pick-up area;

transferring the circuit boards from said pick-up area to a loading station on a testing machine;

discharging tested printed circuit boards from the testing machine, with separation of circuit boards having good circuits from circuit boards having faulty circuits; and detecting the actual position of predetermined data points on each circuit board in the pick-up area;

comparing data of the actual position detected with reference data identifying the correct position of the circuit board;

wherein any possible deviation of the actual position of the circuit board from the correct position found during said comparing step is utilized in said transferring step, so that the circuit board is always picked up in the same way, to be set down precisely in a predetermined area of said loading station of the testing machine.

2. A method according to claim 1, wherein said detecting of the position of the predetermined data points circuit board in the pick-up area is performed by means of a vision system that intercommunicates with a handling system used for transferring the circuit board from the pick-up area to the loading station of the machine, and for emptying the tested circuit board into a magazine for circuit boards having good circuits or a magazine for circuit boards having faulty circuits.

3. A method according to claim 1, further comprising the step of transferring the circuit board from the pick-up area directly to a magazine for unidentified circuits in the event that said vision system does not identify the circuit board to be tested.

4. A method according to claim 2, wherein a circuit board to be tested is transferred from the loading station to a work station of the machine and vice versa, whilst the handling system sets down an already tested circuit board and picks up another circuit board to be tested from the pick-up area.

5. A method according to claim 4, wherein a plurality of circuit boards are transferred from said pick-up area to corresponding predetermined areas of the loading station of the machine for conducting of multiple tests simultaneously.

6. An apparatus for automatic loading and unloading of printed circuit boards on machines for performing electrical testing, comprising a feeding line for circuit boards to be tested and a pick-up areas; means for transferring the circuit boards from the pick-up area to a loading station on the testing machine; and means for unloading tested circuit boards from said loading station to an emptying line for circuit boards having good circuits or into a magazine for circuit boards having faulty circuits; wherein a detection system is provided in said pick-up area to detect the actual position of predetermined data points on each of the circuit boards and make a comparison with a correct reference position; and wherein said means for transferring the circuits from the pick-up area to the loading station on the machine comprise a handling assembly which always picks up the circuit boards in the same points, taking into account any deviation signaled by the detection system with respect the correct reference position, and sets them down in a preestablished area of the loading station of the machine.

7. An apparatus according to claim 6, wherein said detection system in the pick-up area comprises a vision system equipped with a telecamera that records the topography of the circuit, and means for signaling any detected shift in some datum points with respect to their correct positions.

8. An apparatus according to claim 6, wherein said handling assembly also provides a means for transferring tested circuit boards from said loading station of the test machine to said emptying line for circuit boards with good circuits or to said magazine for circuit boards with faulty circuits.

9. An apparatus according to claim 6, wherein said handling assembly directly transfers the circuit boards to be tested from the pick-up area to a magazine for unidentified circuits, in the event that said circuits are not identified by said detection system.

10. An apparatus according to claim 6, wherein said handling assembly (20) provides a means for transferring a plurality of circuit boards from the pick-up area to corresponding pre-established areas of the loading station of the machine, in order to carry out multiple tests simultaneously.

11. An apparatus according to claim 6, wherein said circuit boards are disposed in piles in said pickup area, lifting means being provided for lifting each pile upon consent from a photoelectric cell which detects the topmost circuit in the pile, so that the circuit boards are picked up at substantially the same height.

12. An apparatus according to claim 11, wherein said piles of circuit boards are disposed on special pallets made to advance along the feeding line and the emptying line.

13. An apparatus according to claim 6, wherein said handling assembly comprises a head provided with at least one sucker whose position is adjustable for gripping the circuit boards.

14. An apparatus according to claim 13, in that said head also comprises tongs for automatically transferring empty pallets from the pick-up area of the feeding line to the emptying line.

15. An apparatus according to claim 6, wherein said loading station coincides with the test station of the machine.

16. An apparatus according to claim 6, wherein said loading station is separate from the test station of the machine and carriers or trays are provided for transferring the printed circuit boards from one station to the other.

17. An apparatus according to claim 16, wherein centering means are provided in said loading station to guarantee precise positioning of said carriers or trays for the printed boards.

18. A method of automatic loading and unloading of printed circuit boards on machines for carrying out electrical testing, comprising the steps of:

conveying a plurality of printed circuit to a pick-up area;

transferring the plurality of printed circuit, one-by-one from said pick-up area to respective areas on a loading station of a testing machine;

testing said plurality of printed circuit simultaneously; and discharging the printed circuit boards from said loading station after testing, with classification of the circuit boards into circuit boards with good circuits and circuit boards with faulty circuits based on the results of the testing.

19. An apparatus for automatic loading and unloading of printed circuit boards on machines for carrying out electrical testing, comprising:

a feeding line for conveying a plurality of printed circuit boards to a pick-up area;

means for transferring the plurality of printed circuit boards one-by-one from said pick-up area to respective predetermined areas on a loading station of a testing machine for testing said plurality of printed circuit boards simultaneously;

means for discharging the printed circuit boards from said loading station, after testing, into one of an emptying line for circuit boards with good circuits and a magazine for circuit boards with faulty circuits based on the results of the testing.

* * * * *